(12) United States Patent
Cao et al.

(10) Patent No.: US 9,972,540 B2
(45) Date of Patent: May 15, 2018

(54) SEMICONDUCTOR DEVICE HAVING MULTIPLE THICKNESS OXIDES

(71) Applicant: International Business Machines Corporation, Armonk, NY (US)

(72) Inventors: Qing Cao, Yorktown Heights, NY (US); Kangguo Cheng, Schenectady, NY (US); Zhengwen Li, Chicago, IL (US); Fei Liu, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 10 days.

(21) Appl. No.: 15/230,443

(22) Filed: Aug. 7, 2016

(65) Prior Publication Data

US 2018/0040515 A1    Feb. 8, 2018

(51) Int. Cl.

| | |
|---|---|
| *H01L 21/336* | (2006.01) |
| *H01L 21/28* | (2006.01) |
| *H01L 21/8234* | (2006.01) |
| *H01L 29/51* | (2006.01) |
| *H01L 29/78* | (2006.01) |
| *H01L 21/8238* | (2006.01) |
| *H01L 21/02* | (2006.01) |
| *H01L 29/66* | (2006.01) |
| *H01L 27/088* | (2006.01) |

(52) U.S. Cl.
CPC .. *H01L 21/823462* (2013.01); *H01L 21/0214* (2013.01); *H01L 21/02247* (2013.01); *H01L 21/02252* (2013.01); *H01L 21/823857* (2013.01); *H01L 27/088* (2013.01); *H01L 29/518* (2013.01); *H01L 29/66545* (2013.01); *H01L 21/28088* (2013.01); *H01L 21/28238* (2013.01); *H01L 29/517* (2013.01)

(58) Field of Classification Search
CPC ................ H01L 29/66545; H01L 21/28202
See application file for complete search history.

(56) References Cited

U.S. PATENT DOCUMENTS

| 5,595,922 A | 1/1997 | Tigelaar et al. |
|---|---|---|
| 5,960,289 A | 9/1999 | Tsui et al. |
| (Continued) | | |

FOREIGN PATENT DOCUMENTS

WO    WO2005065385 A2    7/2005

*Primary Examiner* — Victor A Mandala
*Assistant Examiner* — Regan J Rundio
(74) *Attorney, Agent, or Firm* — Law Offices of Ira D. Blecker, P.C.

(57) ABSTRACT

Method for fabricating semiconductor device comprising: forming a dummy gate on a first nitrided oxide layer and a non-nitrided oxide layer; nitridizing an exposed section of the non-nitrided oxide layer to form a second nitrided oxide layer; forming an interlayer dielectric on the first nitrided oxide layer and the second nitrided oxide layer; removing the dummy gate from the first nitrided oxide layer to form a first opening with the first nitrided oxide layer exposed in the first opening; removing the dummy gate from the non-nitrided oxide layer to form a second opening with a non-nitrided portion of oxide layer exposed in the second opening; removing the non-nitrided portion of the oxide layer; forming a first dielectric layer and first metal gate material in the first opening; and forming a second dielectric layer and second metal gate material in the second opening.

20 Claims, 6 Drawing Sheets

(56) References Cited

U.S. PATENT DOCUMENTS

| | | | |
|---|---|---|---|
| 6,087,225 A | 7/2000 | Bronner et al. | |
| 6,368,923 B1 * | 4/2002 | Huang | H01L 21/82345 257/E21.623 |
| 6,403,426 B1 * | 6/2002 | Montree | H01L 21/26586 257/E21.345 |
| 6,642,543 B1 | 11/2003 | El Gamal et al. | |
| 6,720,221 B1 | 4/2004 | Ahn et al. | |
| 6,787,827 B2 * | 9/2004 | Inumiya | H01L 21/28185 257/288 |
| 6,833,308 B2 | 12/2004 | Ahn et al. | |
| 6,977,543 B2 | 12/2005 | Heedley et al. | |
| 7,160,771 B2 | 1/2007 | Chou et al. | |
| 7,301,401 B2 | 11/2007 | Pennock | |
| 7,345,342 B2 | 3/2008 | Challa et al. | |
| 7,939,395 B2 | 5/2011 | Abadeer et al. | |
| 9,034,714 B2 * | 5/2015 | Won | H01L 21/82346 257/E21.336 |
| 2014/0001540 A1 * | 1/2014 | Wang | H01L 29/66666 257/329 |
| 2014/0302678 A1 | 10/2014 | Paterson et al. | |

* cited by examiner

SEMICONDUCTOR DEVICE HAVING MULTIPLE THICKNESS OXIDES

BACKGROUND

The present exemplary embodiments pertain to semiconductor devices and, more particularly, pertain to semiconductor devices having oxides of different thicknesses and reduced gate to source/drain capacitance.

In current complementary metal-oxide-semiconductor (CMOS) field effect transistor (FET) designs, thick oxide FETs may be used for input devices, output devices, analog devices and memory devices. Thin oxide FETs may be used for logic devices. Often, both thick oxide FETs and thin oxide FETs may be on the same semiconductor device.

Various integration schemes have been proposed for forming thick oxide FETs and thin oxide FETs on the same semiconductor device.

BRIEF SUMMARY

The various advantages and purposes of the exemplary embodiments as described above and hereafter are achieved by providing, according to an aspect of the exemplary embodiments, a method for fabricating semiconductor device comprising: forming an oxide layer on a semiconductor substrate; nitridizing a first portion of the oxide layer to form a first nitrided oxide layer; forming a dummy gate on the first nitrided oxide layer and on a second portion of the oxide layer; nitridizing an exposed section of the second portion of the oxide layer not covered by the dummy gate on the second portion of the oxide layer to form a second nitrided oxide layer; forming an interlayer dielectric on the first nitrided oxide layer and on the second nitrided oxide layer; removing the dummy gate from the first nitrided oxide layer to form a first opening with the first nitrided oxide layer exposed in the first opening; removing the dummy gate from the second portion of the oxide layer to form a second opening with a non-nitrided section of the second portion of the oxide layer exposed in the second opening; removing the non-nitrided section of the second portion of the oxide layer; forming a first dielectric layer in the first opening and filling a remainder of the first opening with a first metal gate material; and forming a second dielectric layer in the second opening and filling a remainder of the second opening with a second metal gate material.

According to another aspect of the exemplary embodiments, there is provided a method for fabricating semiconductor device comprising: forming an oxide layer on a semiconductor substrate; nitridizing a first portion of the oxide layer to form a first nitrided oxide layer while simultaneously protecting the second portion of the oxide layer during the nitridization from being nitrided; forming a dummy gate on the first nitrided oxide layer and a second portion of the oxide layer; nitridizing an exposed section of the second portion of the oxide layer not covered by the dummy gate on the second portion of the oxide layer to form a second nitrided oxide layer; forming spacers on the first nitrided oxide layer adjacent to the dummy gate on the first nitrided oxide layer; forming spacers on the second nitrided oxide layer adjacent to the dummy gate on the second nitrided oxide layer; forming an interlayer dielectric on the first nitrided oxide layer and the second portion of the oxide layer; removing the dummy gate from the first nitrided oxide layer to form a first opening with the first nitrided oxide layer exposed in the first opening; removing the dummy gate from the second portion of the oxide layer to form a second opening with a non-nitrided section of the second portion of the oxide layer exposed in the second opening; removing the non-nitrided section of the second portion of the oxide layer; forming a first dielectric layer in the first opening and filling a remainder of the first opening with a first metal gate material; and forming a second dielectric layer in the second opening and filling a remainder of the second opening with a second metal gate material.

According to a further aspect of the exemplary embodiments, there is provided a semiconductor device comprising: a semiconductor substrate having a first portion having a first nitrided oxide thickness and a second portion having a second nitrided oxide thickness; the first portion comprising a first nitrided oxide layer on the semiconductor substrate, a gate on the first nitrided oxide layer and an interlevel dielectric layer on the first nitrided oxide layer and adjacent to the gate, the gate comprising a first dielectric layer and a first metallic gate material; the second portion comprising a second nitrided oxide layer on the semiconductor substrate and having a gap where the second nitrided oxide layer is not on the semiconductor substrate, a gate positioned in the gap so as to be in contact with the semiconductor substrate, and the interlevel dielectric layer on the second nitrided oxide layer and adjacent to the gate, the gate comprising a second dielectric layer and a second metallic gate material.

BRIEF DESCRIPTION OF SEVERAL VIEWS OF THE DRAWINGS

The features of the exemplary embodiments believed to be novel and the elements characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

FIGS. 2A to 14A illustrate the process steps in FIG. 1 for forming semiconductor devices with a thick oxide region and FIGS. 2B to 14B illustrate the process steps in FIG. 1 for forming semiconductor devices with a thin oxide region.

DETAILED DESCRIPTION

The exemplary embodiments propose a novel integration scheme in which a nitrided oxide may be used for semiconductor devices in which there is a thick oxide and use a non-nitrided oxide under the gate area for semiconductor devices in which there is a thin oxide. The non-nitrided oxide allows for its easy removal without affecting the nitrided thick oxide areas. Such an integration scheme may limit gate versus source/drain overlap which may also limit RC delay.

In terms of the exemplary embodiments, it may be more relevant to say that the semiconductor devices have multiple thicknesses with the "thick" oxide FETs having a greater thickness than the "thin" oxide FETs. In the following description of the exemplary embodiments, it should be understood that references to a "thick" oxide region and a "thin" oxide region mean that FETs formed in the "thick" oxide region have a greater oxide thickness than FETs formed in the "thin" oxide region.

Figure 1:
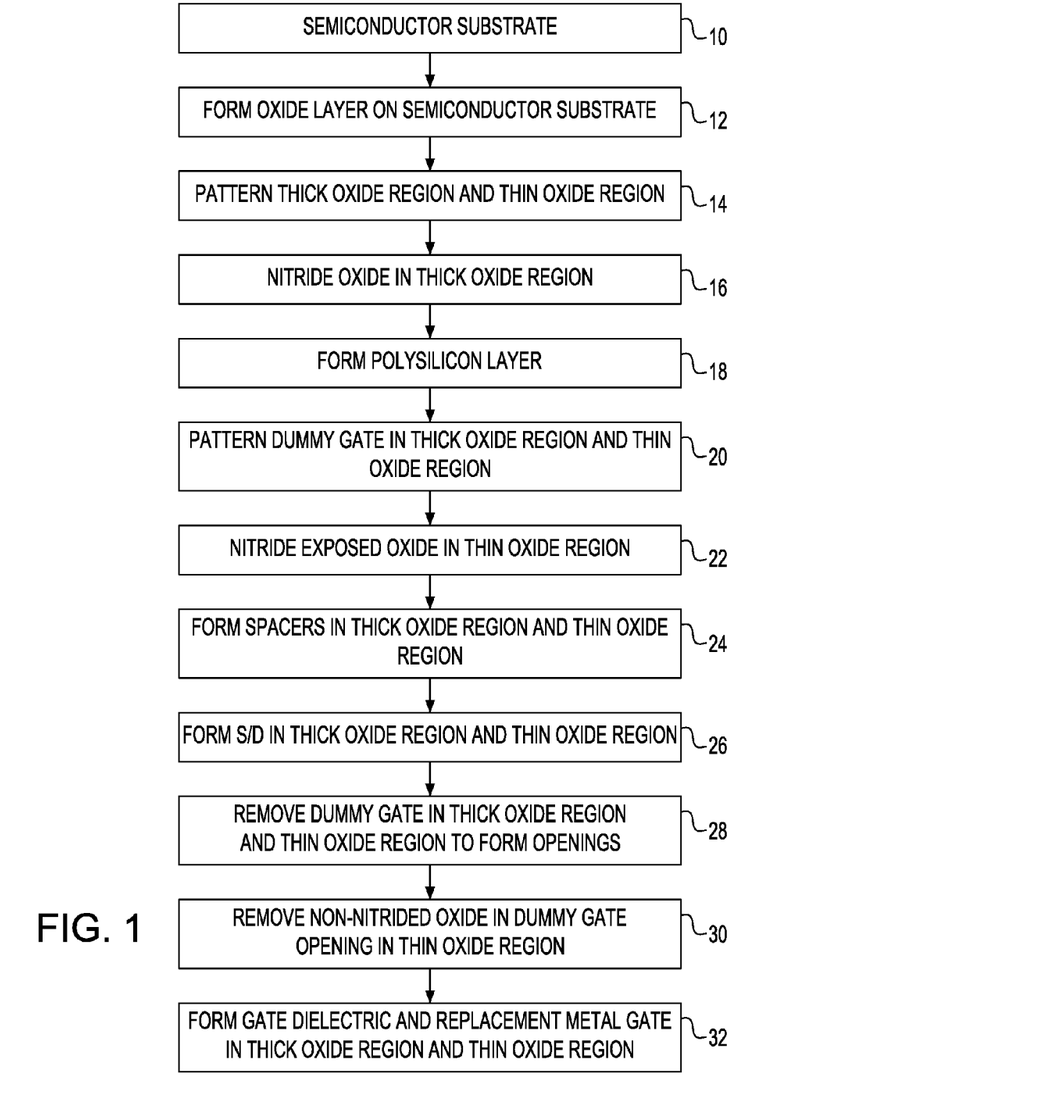
FIG. 1 is a flow chart of a process for forming semiconductor devices with multiple thickness oxide regions according to the exemplary embodiments.
Figure 2A:
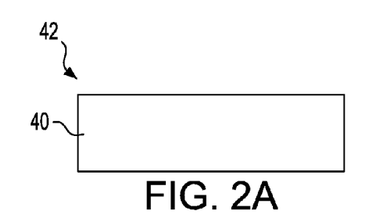
Figure 2B:
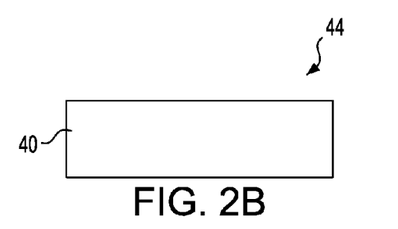

Referring now to the Figures in more detail, FIG. 1 illustrates a flow chart of a process for fabricating the exemplary embodiments.

The exemplary embodiments begin with a semiconductor substrate, box 10, followed by forming an oxide layer, such as silicon oxide, over the semiconductor substrate, box 12, and then patterning a thick oxide region and a thin oxide region from the oxide layer on the semiconductor substrate, box 14.

The thick oxide region may then undergo a nitridizing process to nitride the oxide layer in the thick oxide region, box 16. A nitrided oxide layer is thus formed in the thick oxide region. The oxide layer in the thin oxide region may be protected from the nitridizing process while the oxide layer in the thick oxide region undergoes the nitridizing process.

A layer of polysilicon is deposited, box 18, and then dummy gates are patterned in both the thick oxide region and thin oxide region, box 20.

The oxide that is exposed in the thin oxide region, that is the oxide that is not covered by the dummy gate, undergoes a nitridizing process, box 22.

Spacers may be formed adjacent to the dummy gates in the thick oxide region and in the thin oxide region, box 24.

A source and drain may also be formed in the thick oxide region and thin oxide region, box 26.

The dummy gates may be removed in the thick oxide region and thin oxide region, box 28, to form openings.

Once the dummy gate in the thin oxide region is removed, the oxide layer that was underlying that dummy gate is now exposed through the opening. Since the dummy gate was protecting the underlying oxide layer from nitridizing, the underlying oxide layer is a non-nitrided oxide layer. This non-nitrided oxide layer may be removed, box 30.

Gate dielectric and replacement gate metal fill may be deposited in the openings left from the removal of the dummy gates in the thick oxide region and thin oxide region, box 32.

Process details to implement the process just described in the flow chart in FIG. 1 will be described with respect to FIGS. 2A to 14A and FIGS. 2B to 14B. FIGS. 2A to 14A describe processing with respect to the thick oxide region, generally indicated by 42, while FIGS. 2B to 14B describe processing with respect to the thin oxide region, generally indicated by 44.

In one exemplary embodiment, semiconductor structures having both a thick oxide region and a thin oxide region may be on the same semiconductor device (i.e., the same chip). In another exemplary embodiment, semiconductor structures having both a thick oxide region and a thin oxide region may be on the same wafer but not necessarily on the same semiconductor device.

The exemplary embodiments may be used in both a planar structure and a nonplanar structure. Thus, semiconductor substrate, 40. Illustrated in FIGS. 2A and 2B may be a planar semiconductor substrate or may be a fin in a nonplanar structure.

Figure 3A:
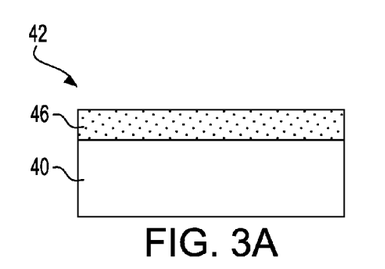
Figure 3B:
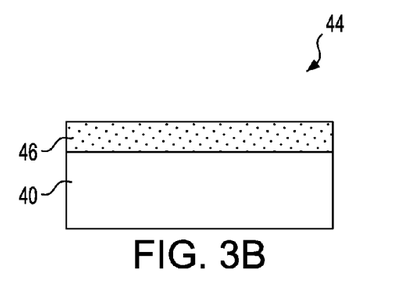

A thick oxide layer 46 may be deposited on the semiconductor substrate 40 as illustrated in FIGS. 3A and 3B. The thick oxide layer 46 may have a thickness of about 30 to 60 Å (angstroms). The oxide may be, for example, silicon oxide.

Figure 4A:
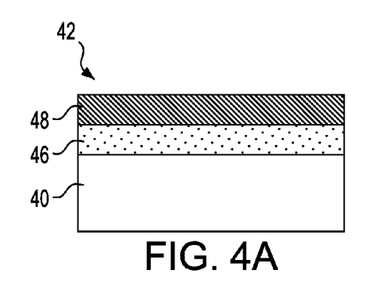
Figure 4B:
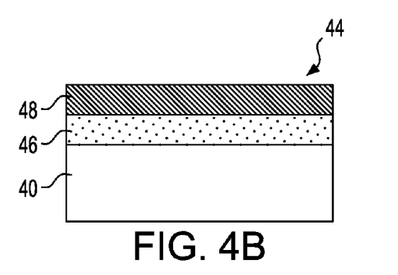

The thick oxide layer 46 may be patterned into a thick oxide layer 46 in the thick oxide region 42 and a thick oxide layer 46 in the thin oxide region 44. Patterning may be by depositing a hard mask layer 48 over the semiconductor substrate as illustrated in FIGS. 4A and 4B followed by a photoresist to define the oxide layer in the thick oxide region 42 and the thin oxide region 44. The photoresist in the thick oxide region 42 may be removed by, for example, an ashing process followed by an etching process such as reactive ion etching (RIE) and a wet process to remove the photoresist and hard mask layer 48 in the thick oxide region 42.

Figure 5A:
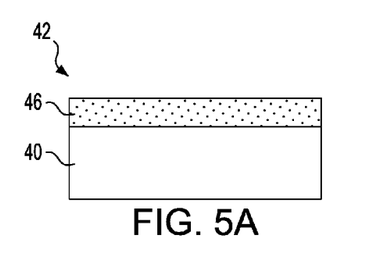
Figure 5B:
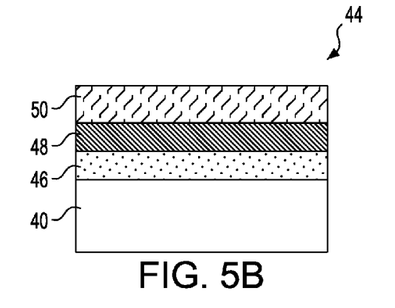

Referring now to FIG. 5B, the photoresist 50 and hard mask layer 48 remain on the thick oxide 46 in the thin oxide region 44. The photoresist 50 and hard mask layer 48 have been stripped from the thick oxide layer 46 in the thick oxide region 42 as shown in FIG. 5A.

Figure 6A:
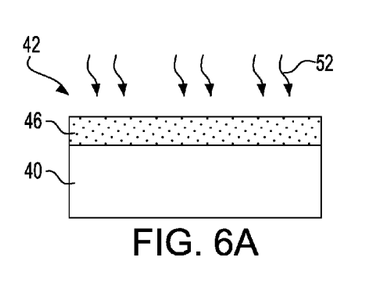
Figure 6B:
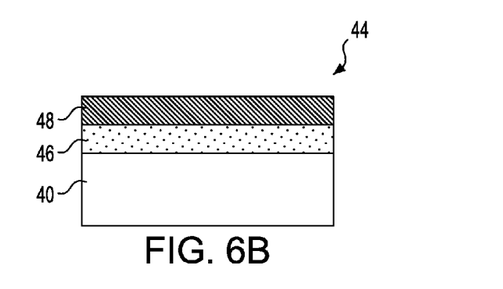
Figure 7A:
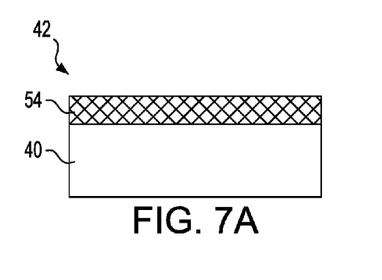
Figure 7B:
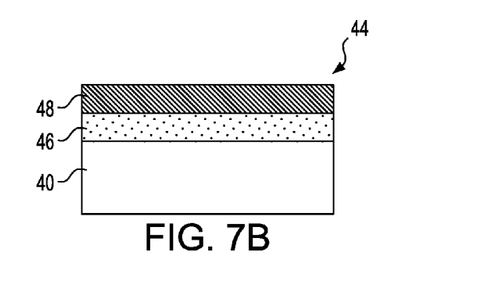

The thick oxide layer 46 in the thick oxide region 42 may then undergo a nitridizing process to nitride the thick oxide layer 46 in the thick oxide region 42. In one exemplary nitridizing process illustrated in FIG. 6A, the thick oxide 46 may be exposed to a nitrogen plasma, indicated by arrows 52, followed by an annealing process. For the purpose of illustration and not limitation, the nitrogen plasma may be from a densified plasma nitridation process and the annealing process may be heating to 700 to 800° C. for about 30 seconds. After the nitridizing process and annealing, a nitrided oxide ($SiON_x$) layer 54 is formed in the thick oxide region 42 as shown in FIG. 7A. The thick oxide layer 46 in the thin oxide region 44 may be protected from the nitridizing process by hard mask layer 48 while the thick oxide layer 46 in the thick oxide region 42 undergoes the nitridizing process. The protective hard mask layer 48 is shown in FIGS. 6B and 7B.

Figure 8A:
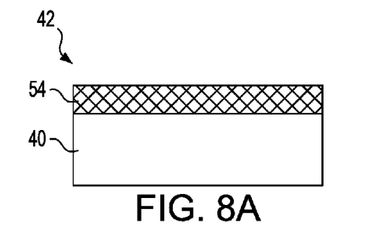
Figure 8B:
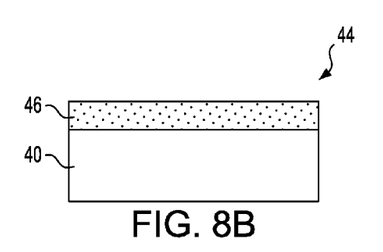

In FIG. 8B the hard mask layer 48 has been stripped to reveal the thick oxide layer 46 in the thin oxide region 44 which has not been nitrided. FIG. 8A illustrates the presence of the nitrided oxide layer 54 in the thick oxide region 42.

Figure 9A:
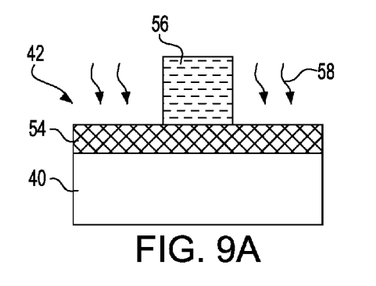
Figure 9B:
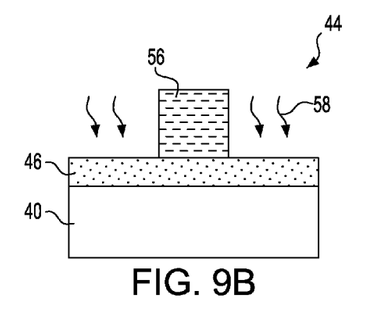

A polysilicon layer has been deposited in the thick oxide region 42 and the thin oxide region 44 and then patterned to form "dummy" gates 56. Dummy gates 56 perform no electrical function and will be replaced later in a gate last process.

Figure 10A:
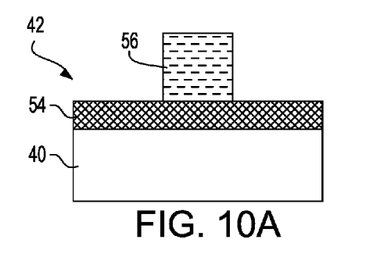
Figure 10B:
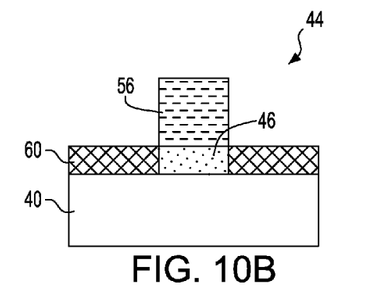

After the formation of the dummy gate 56 in FIG. 9B, the thick oxide layer 46 in the thin oxide region 44 that is not covered by the dummy gate 56 undergoes a nitridizing process 58. The nitridizing process 58 may be the same or a different nitridizing process that was used to form the nitrided oxide layer 54 in the thick oxide region 42. For the purpose of illustration and not limitation, the nitridizing process 58 is a nitrogen plasma process followed by an annealing process by heating to 700 to 800° C. for about 30 seconds. After the nitridizing process illustrated in FIG. 9B, the thick oxide layer 46 exposed to the nitridizing process 58 is now a nitrided oxide layer 60, such as $SiON_x$, as shown in FIG. 10B. It is noted that the portion of thick oxide layer 46 underneath the dummy gate 56 in the thin oxide region 44 remains non-nitrided.

The nitrided oxide layer 54 on the thick oxide region 42 may also be exposed to the nitridizing process 58 used to form nitrided oxide layer 60 and may undergo further mitridizing as indicated by the darker shade of nitrided oxide layer 54. In this situation, the nitridizing process 52 first used to form nitrided oxide layer 54 and the subsequent nitridizing process 58 used to form nitrided oxide layer 60 may need to be tuned so that the optimum properties for the nitrided oxide layer 54 and the nitrided oxide layer 60 are obtained. Such tuning of the processes is well within the expertise of one skilled in the art of semiconductor processing.

Figure 11A:
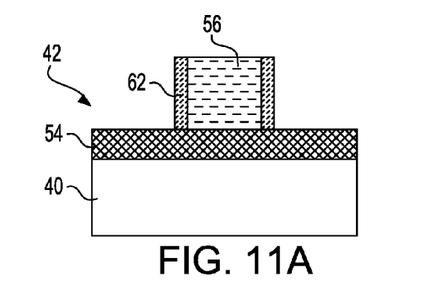
Figure 11B:
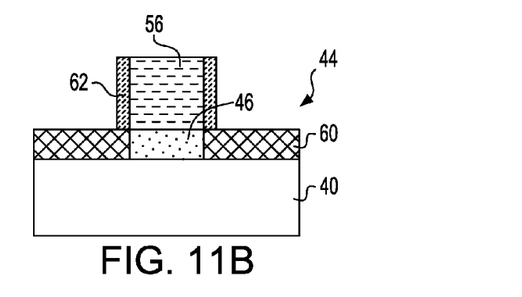

Referring now to FIGS. 11A and 11B, spacers 62 may be conventionally formed adjacent to the dummy gates 56 in the thick oxide region 42 and in the thin oxide region, box 44.

Figure 12A:
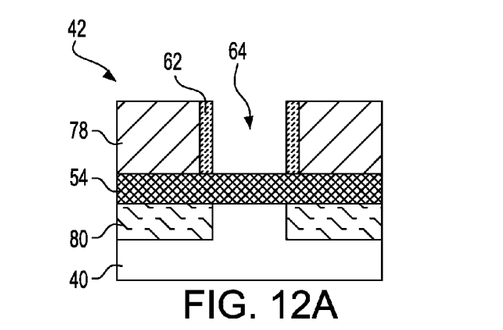
Figure 12B:
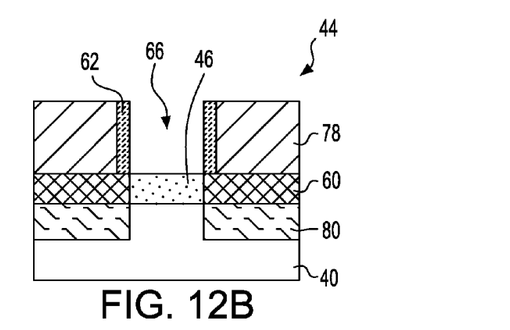

In other process steps, a source and drain 80 and interlayer dielectric 78 may be formed in the thick oxide region 42 and the thin oxide region 44. The dummy gates 56 may be removed such as by a wet etching process such as warm ammonia in the thick oxide region 42 and the thin oxide region 44 to form opening 64 in the thick oxide region 42 and opening 66 in the thin oxide region 44. The resultant structures are shown in FIGS. 12A and 12B.

When the dummy gates 56 are removed, the underlying layer is exposed. As can be seen in FIG. 12A pertaining to the thick oxide region 42, the nitrided oxide layer 54 is exposed through the opening 64 formerly occupied by the dummy gate 56. With respect to the thin oxide region 44 shown in FIG. 12B, the underlying layer exposed through the opening 66 is non-nitrided oxide layer 46 since the dummy gate 56 protected the thick oxide layer 46 during the nitridizing process 58 previously described with respect to FIG. 9B.

Figure 13A:
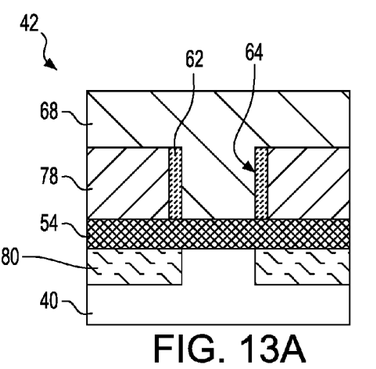
Figure 13B:
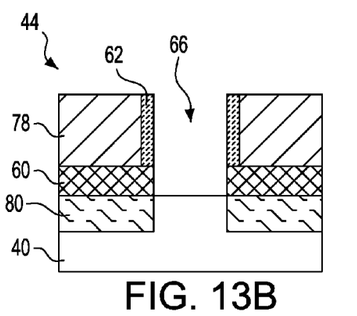

The non-nitrided oxide layer 46 in the thin oxide region 44 may be removed by, for example a wet etching process, such as dilute HF (hydrofluoric acid) or buffered HF, as illustrated in FIG. 13B. A photoresist 68 may be deposited in the opening 64 to protect the underlying nitrided oxide layer 54 in the thick oxide region 42 as illustrated in FIG. 13A. After removal of the non-nitrided oxide layer 46 from the opening 66 in the thin oxide region 44, the photoresist 68 may be stripped from the opening 64 in the thick oxide region 42.

Figure 14A:
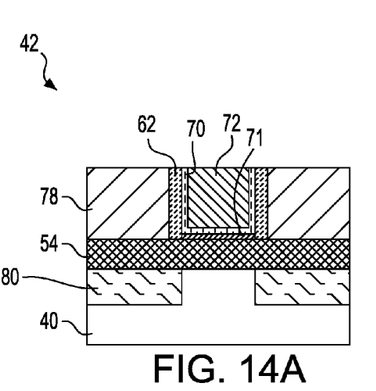

Gate dielectric 70 may be deposited in the opening 64 in the thick oxide region 42 followed by a replacement gate metal fill 72. Prior to the formation of the gate dielectric 70, an interfacial oxide 71 may be deposited or formed. The gate dielectric 70 may be formed only on the bottom of the opening 64 or on the bottom and sides of the opening 64.

Figure 14B:
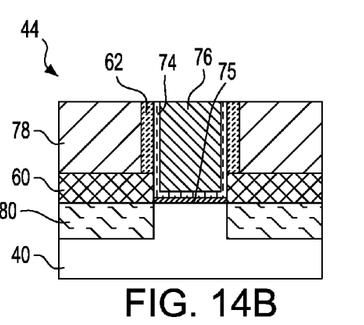

Gate dielectric 74 may be deposited in the opening 66 in the thin oxide region 44 followed by a replacement gate metal fill 76. Prior to the formation of the gate dielectric 74, an interfacial oxide 75 may be deposited or formed. The gate dielectric 74 may be formed only on the bottom of the opening 66 or on the bottom and sides of the opening 66.

The interfacial oxides 71, 75 may have a thickness of about 6 to 12 Å. The gate dielectrics 70, 74 may have a thickness of about 40 Å.

The gate dielectrics 70, 74 may include any dielectric materials now or hereafter used for gate dielectrics, including but not limited to high dielectric constant dielectric materials. The replacement gate metal fills 72, 76 may include any replacement gate metal fills now or hereafter used for gate metal, including but not limited to titanium nitride, tantalum nitride, aluminum and tungsten.

It should be understood that the gate dielectrics 70, 74 may be the same or different materials. Similarly, the replacement gate metal fills 72, 76 may be the same or different materials.

It will be apparent to those skilled in the art having regard to this disclosure that other modifications of the exemplary embodiments beyond those embodiments specifically described here may be made without departing from the spirit of the invention. Accordingly, such modifications are considered within the scope of the invention as limited solely by the appended claims.

What is claimed is:

1. Method for fabricating semiconductor device comprising:

forming an oxide layer on a semiconductor substrate;

nitridizing a first portion of the oxide layer to form a first nitrided oxide layer;

forming a dummy gate on the first nitrided oxide layer and on a second portion of the oxide layer;

nitridizing an exposed section of the second portion of the oxide layer not covered by the dummy gate on the second portion of the oxide layer to form a second nitrided oxide layer;

forming an interlayer dielectric on the first nitrided oxide layer and on the second nitrided oxide layer;

removing the dummy gate from the first nitrided oxide layer to form a first opening with the first nitrided oxide layer exposed in the first opening;

removing the dummy gate from the second portion of the oxide layer to form a second opening with a non-nitrided section of the second portion of the oxide layer exposed in the second opening;

removing the non-nitrided section of the second portion of the oxide layer;

forming a first dielectric layer in the first opening and filling a remainder of the first opening with a first metal gate material; and forming a second dielectric layer in the second opening and filling a remainder of the second opening with a second metal gate material.

2. The method of claim 1 further comprising forming spacers on the first nitrided oxide layer, forming a source and a drain in the semiconductor substrate underneath the first nitrided oxide layer, forming spacers on the second nitrided oxide layer and forming a source and a drain in the semiconductor substrate underneath the second nitrided oxide layer.

3. The method of claim 1 wherein the first dielectric layer is in contact with the first nitrided oxide layer and the second dielectric layer is in contact with the semiconductor substrate.

4. The method of claim 3 wherein the first nitrided oxide layer in contact with the first dielectric layer and the first dielectric layer together have a first thickness and the second dielectric layer in contact with the semiconductor substrate has a second thickness such that the first thickness is greater than the second thickness.

5. The method of claim 1 wherein nitridizing the first portion of the oxide layer further includes protecting the second portion of the oxide layer during the nitridizing from being nitrided.

6. The method of claim 1 wherein nitridizing the first portion of the oxide layer is by a nitrogen plasma process.

7. The method of claim 1 wherein nitridizing the exposed section of the second portion of the oxide layer is by a nitrogen plasma process.

8. The method of claim 1 wherein removing the non-nitrided section of the second portion of the oxide layer further includes protecting the first nitrided oxide layer during the removing.

9. The method of claim 1 wherein the first dielectric layer and the second dielectric layer are continuous on sides and a bottom of the first opening and the second opening, respectively.

10. Method for fabricating semiconductor device comprising:
forming an oxide layer on a semiconductor substrate;
nitridizing a first portion of the oxide layer to form a first nitrided oxide layer while simultaneously protecting a second portion of the oxide layer during the nitridizing from being nitrided;
forming a dummy gate on the first nitrided oxide layer and the second portion of the oxide layer;
nitridizing an exposed section of the second portion of the oxide layer not covered by the dummy gate on the second portion of the oxide layer to form a second nitrided oxide layer;
forming spacers on the first nitrided oxide layer adjacent to the dummy gate on the first nitrided oxide layer;
forming spacers on the second nitrided oxide layer adjacent to the dummy gate on the second portion of the oxide layer;
forming an interlayer dielectric on the first nitrided oxide layer and the second nitrided oxide layer;
removing the dummy gate from the first nitrided oxide layer to form a first opening with the first nitrided oxide layer exposed in the first opening;
removing the dummy gate from the second portion of the oxide layer to form a second opening with a non-nitrided section of the second portion of the oxide layer exposed in the second opening;
removing the non-nitrided section of the second portion of the oxide layer;
forming a first dielectric layer in the first opening and filling a remainder of the first opening with a first metal gate material; and
forming a second dielectric layer in the second opening and filling a remainder of the second opening with a second metal gate material.

11. The method of claim 10 further comprising forming a source and a drain in the semiconductor substrate underneath the first nitrided oxide layer and forming a source and a drain in the semiconductor substrate underneath the second nitrided oxide layer.

12. The method of claim 1 wherein the first dielectric layer is in contact with the first nitrided oxide layer and the second dielectric layer is in contact with the semiconductor substrate such that there is not a nitrided oxide layer between the second dielectric layer and the semiconductor substrate.

13. The method of claim 12 wherein the first nitrided oxide layer in contact with the first dielectric layer and the first dielectric layer together have a first thickness and the second dielectric layer in contact with the semiconductor substrate has a second thickness such that the first thickness is greater than the second thickness.

14. The method of claim 10 wherein nitridizing the first portion of the oxide layer is by a nitrogen plasma process.

15. The method of claim 10 wherein nitridizing the exposed section of the second portion of the oxide layer is by a nitrogen plasma process.

16. The method of claim 10 wherein removing the non-nitrided section of the second portion of the oxide layer further includes protecting the first nitrided oxide layer during the removing.

17. The method of claim 10 wherein the first dielectric layer and the second dielectric layer are continuous on sides and a bottom of the first opening and the second opening, respectively.

18. A semiconductor device comprising:
a semiconductor substrate comprising a first portion and a second portion;
a first nitrided oxide layer having a first nitride oxide thickness formed on the first portion of the semiconductor substrate, a gate on the first nitrided oxide layer and an interlevel dielectric layer on the first nitrided oxide layer and adjacent to the gate, the gate comprising a first dielectric layer and a first metallic gate material;
a second nitrided oxide layer having a second nitrided oxide thickness on the second portion of the semiconductor substrate and having a gap where the second nitrided oxide layer is not on the semiconductor substrate, a gate positioned in the gap so as to be in contact with the semiconductor substrate, and the interlevel dielectric layer on the second nitrided oxide layer and adjacent to the gate, the gate comprising a second dielectric layer and a second metallic gate material;
wherein the first nitrided oxide layer has a greater amount of nitride than the second nitrided oxide layer.

19. The semiconductor device of claim 18 wherein the first nitrided oxide layer and the first dielectric layer together have a first undergate thickness and the second dielectric layer has a second undergate thickness such that the first undergate thickness is greater than the second undergate thickness.

20. The semiconductor device of claim 18 wherein the first dielectric layer and the second dielectric layer are continuous on sides and a bottom of the first metallic gate material and the second metallic gate material, respectively.

* * * * *